United States Patent [19]

Murakami et al.

[11] Patent Number: 4,626,800
[45] Date of Patent: Dec. 2, 1986

[54] YIG THIN FILM TUNED MIC OSCILLATOR

[75] Inventors: Yoshikazu Murakami, Kanagawa; Seigo Ito, Tokyo; Toshiro Yamada, Kanagawa, all of Japan

[73] Assignee: Sony Corporation, Tokyo, Japan

[21] Appl. No.: 740,813

[22] Filed: Jun. 3, 1985

[30] Foreign Application Priority Data

Jun. 5, 1984 [JP] Japan .................. 59-114793

[51] Int. Cl.4 .............................. H03B 5/18
[52] U.S. Cl. .................. 331/96; 331/107 SL; 331/117 D
[58] Field of Search .......... 331/66, 77, 96, 105, 331/107 DP, 107 SL, 117 D, 176, 177 R; 333/202, 204, 205, 219, 246

[56] References Cited

U.S. PATENT DOCUMENTS

| 3,766,494 | 10/1973 | Anbe et al. | 331/117 D X |
| 3,879,677 | 4/1975 | Arnold | 331/117 D X |
| 4,270,097 | 5/1981 | LeTron et al. | 331/117 D X |
| 4,528,529 | 7/1985 | Huijer | 333/246 X |
| 4,547,754 | 10/1985 | Murakami et al. | 333/204 X |

OTHER PUBLICATIONS

Ikuzawa, Y. et al, "Resonant Modes of Magnetostatic Waves in a Normally Magnetized Disc", *Journal of Applied Physics*, vol. 48, No. 7, Jul. 1977, pp. 3001–3007.

Primary Examiner—Eugene R. LaRoche
Assistant Examiner—D. C. Mis
Attorney, Agent, or Firm—Hill, Van Santen, Steadman & Simpson

[57] ABSTRACT

A tuned oscillator is disclosed which comprises an active element, a resonator electrically connected to the active element and made of a magnetic material using ferro-magnetic resonance phenomenon, and a magnetic circuit for applying a magnetic field to the resonator. The resonator is made of an YIG (yttrium, iron and garnet) thin film magnetic resonance element formed by a thin film forming technique and utilizes an uniform mode ferro-magnetic resonance in the YIG thin film, and operating under the application of magnetic field of the magnetic circuit.

8 Claims, 27 Drawing Figures

F I G. 18
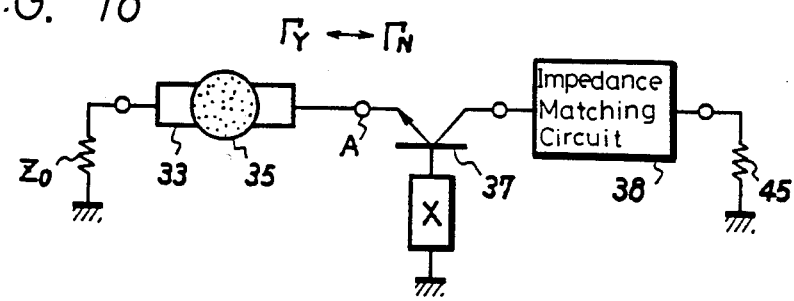
F I G. 19
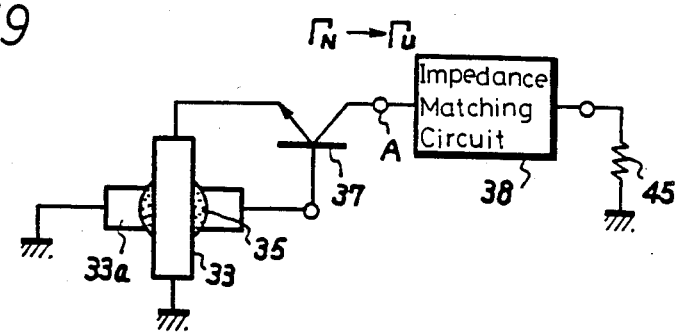
F I G. 20
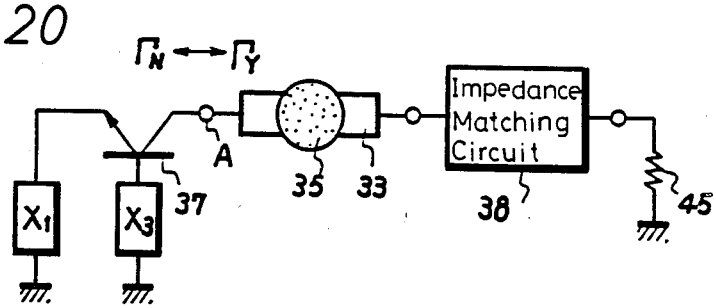
F I G. 21
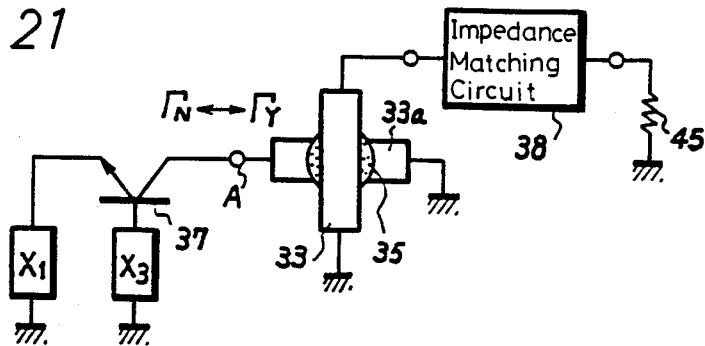

YIG THIN FILM TUNED MIC OSCILLATOR

BACKGROUND OF THE INVENTION

1. Field of the Invention

The present invention relates to a tuned oscillator for being used as a local oscillator for a tuner of a radio receiver, a television receiver and so on, a sweep oscillator for a spectral analyzer, a microwave measuring instrument and so on.

2. Description of the Prior Art

A tuned oscillator, has previously been proposed such one which uses an YIG (where YIG represents yttrium, iron and garnet but it may contain various kinds of additives) single crystal sphere (as is dislcosed in a published examined Japanese patent application No. 32671/1978). This YIG sphere has various features such as the Q value of resonance characteristic is high in the microwave band; it can be constructed to be small because its resonance frequency is independent on the volume of the YIG; the resonance frequency thereof can be varied linearly over a wide band by changing a biasing magnetic field which applied to the YIG sphere.

However, the above-described tuned oscillator has a defect that due to the YIG sphere used therein, the tuned oscillator is difficult to be integrally formed on an MIC (thin film hybrid microwave integrated circuit) substrate and hence its construction flexibility is restricted. Further, this YIG-tuned oscillator has disadvantages in that the coupling tightness must be matched by adjusting lead wires or ribbons constituting a coupling loop of the YIG sphere and by adjusting the position between the coupling loop and the YIG sphere and that this tuned oscillator is easily affected by vibration.

OBJECTS AND SUMMARY OF THE INVENTION

It is an object of the present invention to provide an improved tuned oscillator utilizing ferromagnetic resonance.

It is another object of the present invention to provide a tuned oscillator having uniform characteristics.

It is a further object of the present invention to provide a tuned oscillator which has a simple construction which is small.

According to one aspect of the present invention there is provided a tuned oscillator which comprises:
an active element; and
a ferromagnetic resonator connected to said active element;
said ferromagnetic resonator being formed of a ferrimagnetic crystal, a microstrip line magnetically coupled to said ferrimagnetic crystal and D.C. bias magnetic field means applying D.C. bias magnetic field to said ferrimagnetic crystal, said ferrimagnetic crystal being formed of an YIG thin film formed by thin film forming technique and being processed to suppress magnetostatic mode of ferromagnetic resonance other than uniform mode.

The other objects, features and advantages of the present invention will become apparent from the following description taken in conjunction with the accompanying drawings through which the like references designate the same elements and parts.

BRIEF DESCRIPTION OF THE DRAWINGS

FIGS. 18 to 25 are respectively diagrams showing other embodiments of the oscillating circuits according to the present invention.

DESCRIPTION OF THE PREFERRED EMBODIMENTS

Now, an embodiment of the tuned oscillator according to the present invention will hereinafter be described with reference to the drawings.

Figure 1:
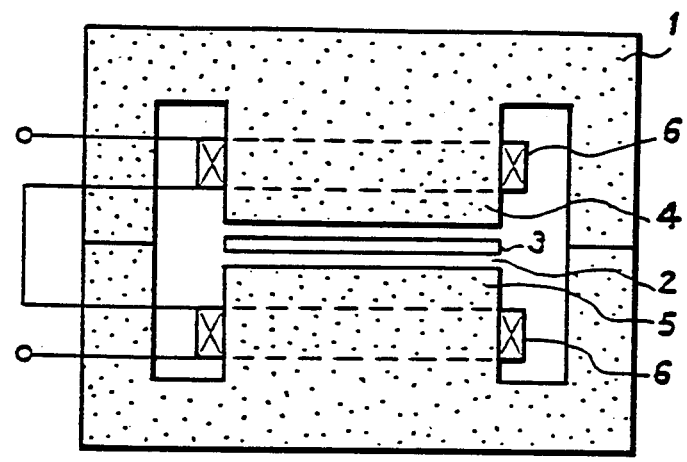
FIG. 1 is a cross-sectional view illustrating an embodiment of a tuned oscillator according to the present invention.

In this embodiment, as shown in FIG. 1, there is provided a yoke 1 made of magnetic material such as ferrite and so on in which a magnetic gap 2 is formed. In the magnetic gap 2, there is located a substrate 3 which incorporates therein an oscillating circuit. A coil 6 is wound around at least one of the magnetic poles 4 and 5 which are opposed to each other to constitute the magnetic gap 2 of the yoke 1 and a variable current is supplied to the coil 6 and, thus a variable magnetic field applying means is formed.

Figure 2:
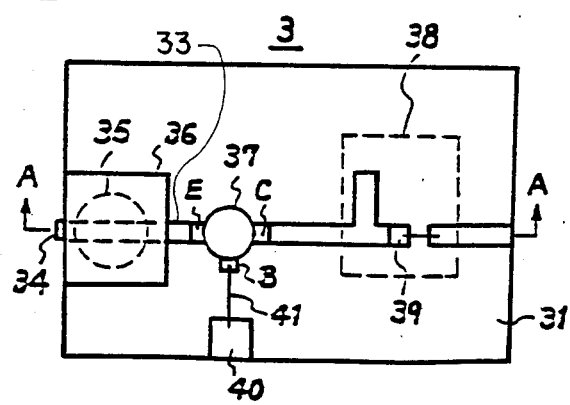
FIG. 2 is a plan view showing a practical structure of the oscillating circuit.
Figure 3:
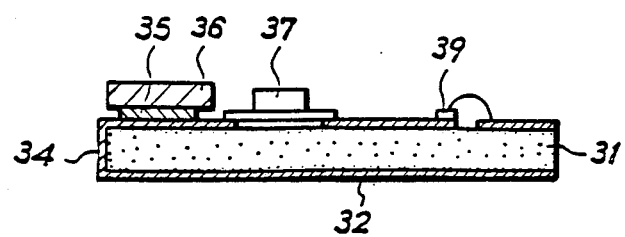
FIG. 3 is a cross-sectional view taken along a line A—A in FIG. 2.

FIG. 2 is a plan view illustrating an example of the practical construction of the substrate 3 which incorporates therein the oscillating circuit and FIG. 3 is a cross-sectional view taken along a line A—A in FIG. 2. As shown in FIGS. 2 and 3, a ground conductor 32 is formed on a first major surface of a dielectric substrate 31 made of a material such as alumina and so on. A microstrip line 33 is formed on a second major surface of the dielectric substrate 31 with, one end of connected through a conductor 34 to the ground conductor 32. The microstrip line 33 is electromagnetically coupled with an YIG thin film magnetic resonance element 35. The YIG thin film magnetic resonance element 35 is formed as follows. An YIG thin film of ferrimagnetism material is formed on one major surface of, for example, a GGG (gadolinium gallium garnet) substrate 36 by a thin film forming technique such as sputtering, chemical vapor deposition method (CVD method), liquid phase epitaxial growth method (LPE method) and so on and this YIG thin film is shaped as, for example, a disk shaped pattern by photolithography technique. In FIGS. 2 and 3, reference numeral 37 designates a high frequency bipolar transistor, reference numeral 38 designates an impedance matching circuit and reference numeral 39 designates a DC blocking MOS (metal oxide semiconductor) capacitor. In this embodiment, the base B of the bipolar transistor 37 is connected to a ground pad 40, connected to the ground conductor 32, through a wire 41 which forms a reactance. The emitter E thereof is connected to the side of the YIG thin film magnetic resonance element 35 and the collector C thereof is connected to the impedance matching circuit 38, thus a so-called common base series feedback oscillator being formed.

Figure 4A:
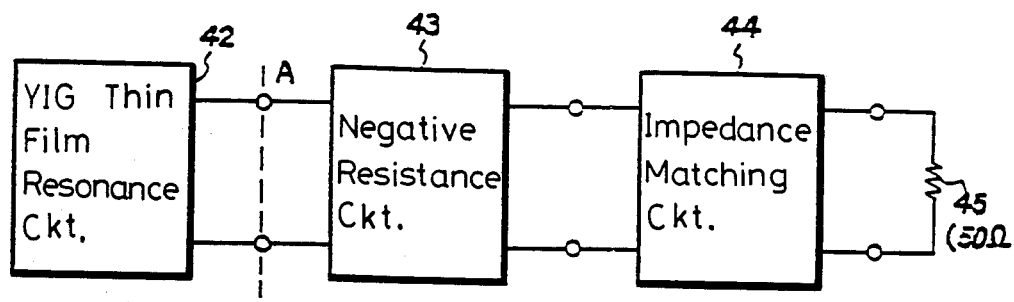
FIGS. 4a and 4b are block diagrams useful for explaining the oscillating circuit.
Figure 4B:
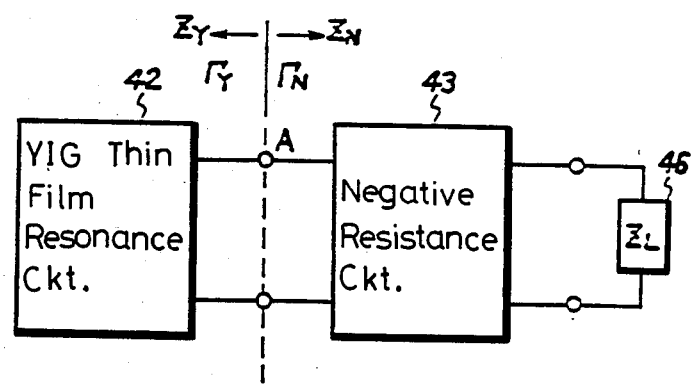

An explanation will be given of the oscillator principle and the oscillating condition of the oscillating circuit which uses the YIG thin film magnetic resonance element 35 as its resonator. The oscillating circuit in which the resonator or the YIG thin film magnetic resonance element 35 is inserted into a feedback circuit other than an output circuit will be described. FIGS. 4A and 4B are respectively block diagrams showing this oscillating circuit. In FIGS. 4A and 4B, reference numeral 42 designates an YIG thin film resonance circuit, reference numeral 43 designates a negative resistance circuit, reference numeral 44 designates an impedance matching circuit and reference numeral 45 designates a load. In FIG. 4B, reference numeral 46 designates a load impedance which includes the impedance matching circuit.

In FIGS. 4a and 4b, respective reflection coefficients $\Gamma_Y$ and $\Gamma_N$ for the YIG thin film resonance circuit side or, namely, the YIG feedback circuit side and for the active element side, namely, the negative resistance circuit side from a terminal A are respectively expressed by the following equations for their impedances $Z_Y$ and $Z_N$ seen from the terminal A.

$$\Gamma_Y = \frac{Z_Y - Z_0}{Z_Y + Z_0} \qquad (1)$$

$$\Gamma_N = \frac{Z_N - Z_0}{Z_N + Z_0} \qquad (2)$$

where $Z_0$ is the characteristic impedance (50 $\Omega$) of the circuit.

The stationary oscillating condition is expressed using the impedances $\Gamma_Y$ and $\Gamma_N$ as $$\Gamma_Y \Gamma_N = 1 \qquad (3)$$

Since the impedances $\Gamma_Y$ and $\Gamma_N$ are both complex numbers, Eq. (3) can be rewritten as the following equation if it is separated as to the amplitude and phase $$|\Gamma_Y| \, |\Gamma_N| e^{j(\theta_Y + \theta_N)} = 1$$

namely $$|\Gamma_Y| |\Gamma_N| = 1 \qquad (4)$$

$$\theta_Y + \theta_N = 0 \qquad (5)$$

Since the YIG feedback circuit as a passive element circuit has a positive effective resistance corresponding to the loss of the YIG thin film resonator, Eq. (1) yields $|\Gamma_Y| < 1$. Accordingly, to establish the oscillating condition given by Eq. (4), the condition of $|\Gamma_N| > 1$ must be established and thence from Eq. (2), it is understood that the impedance $Z_N$ is required to have a negative effective resistance.

Figure 5:
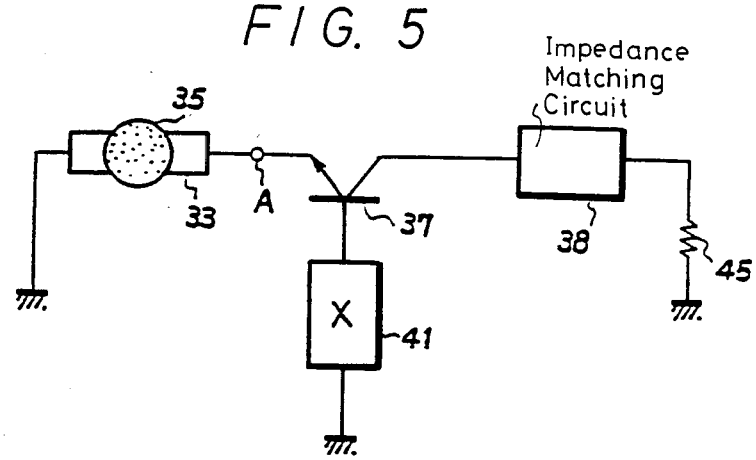
FIG. 5 is a circuit diagram showing an example of the oscillating circuit.

While the negative resistance circuit 43 in FIGS. 4A and 4B may be a 2-terminal active element serving as a negative resistance element or a combination of a circuit made of a 3-terminal active element and a feedback element, in the example shown in FIGS. 2 and 3, the high frequency bipolar transistor of a 3-terminal active element is used and is formed as the common base series feedback type oscillating circuit as shown in FIG. 5. In FIG. 5, reference letter X designates a reactive circuit.

Although the stationary oscillating condition of the oscillating circuit has been described so far, the following condition must be established so as to cause the oscillating circuit to oscillate.

$$|\Gamma_Y| |\Gamma_{Ns}| > 1 \qquad (6)$$

namely $$|\Gamma_Y| > (1/|\Gamma_{Ns}|) \qquad (7)$$

where $\Gamma_{Ns}$ is the value of $\Gamma_N$ in a small signal. When the oscillating circuit begins to oscillate and the active element begins to operate with a large amplitude, the absolute value of the negative resistance becomes small and $1/|\Gamma_N|$ gradually becomes large. When Eq. (2) is established, the oscillation of the oscillating circuit maintains a stationary state.

On the basis of the above-described explanation, the operating principle of the YIG oscillating circuit will be described with reference to a Smith chart of FIG. 6.

Figure 6:
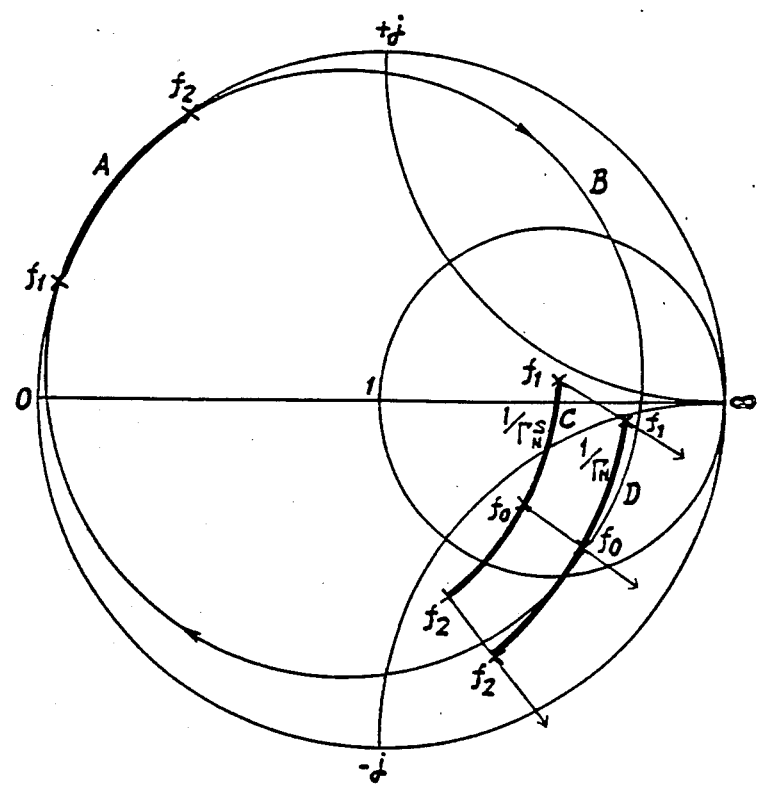
FIG. 6 is a Smith chart useful for explaining the oscillation operation.

As illustrated in FIG. 6, while under the condition of a signal with small amplitude, $1/\Gamma_N$ is in the state shown on a curve C which is relatively near the inside of the Smith chart and, it passes the state shown by curve D and moves in the direction shown by arrows as the active element operates with a larger amplitude.

In the YIG oscillating circuit described before in connection with FIGS. 2 and 3, when the YIG thin film magnetic resonance element 35 does not resonate, it becomes a mere strip line with the tip end short-circuited so that $\Gamma_Y$ subtends a locus as shown by A in FIG. 6. As will be clear from FIG. 6, the phase condition for the oscillation as given when Eq. (5) is not satisfied by the reflection coefficient $\Gamma_N$ has any amplitude and thus no oscillation is caused.

If the YIG thin film magnetic resonance element 35 has a DC magnetic field applied so that it resonates frequency $f_0$ between frequencies $f_1$ and $f_2$, with a frequency near the frequency $f_0$, the reflection coefficient $\Gamma_Y$ draws a locus as shown by B in FIG. 6. At this time, at a frequency near the frequency $f_0$, the amplitude condition given by Eq. (7) and the phase condition given by Eq. (5) for starting the oscillation are established at the same time. When the oscillation is started and $1/\Gamma_N$ moves from the curve C to the curve D in FIG. 6, Eqs. (4) and (5) are established at the same time at the frequency $f_0$ so that the oscillating circuit oscillates at the fixed oscillating frequency $f_0$.

If, under this principle, the resonance frequency of the YIG thin film element 35 is varied over a range from $f_1$ to $f_2$ by varying DC magnetic field applied thereto, the oscillating circuit oscillates at a frequency near the resonance frequency.

Figure 7:
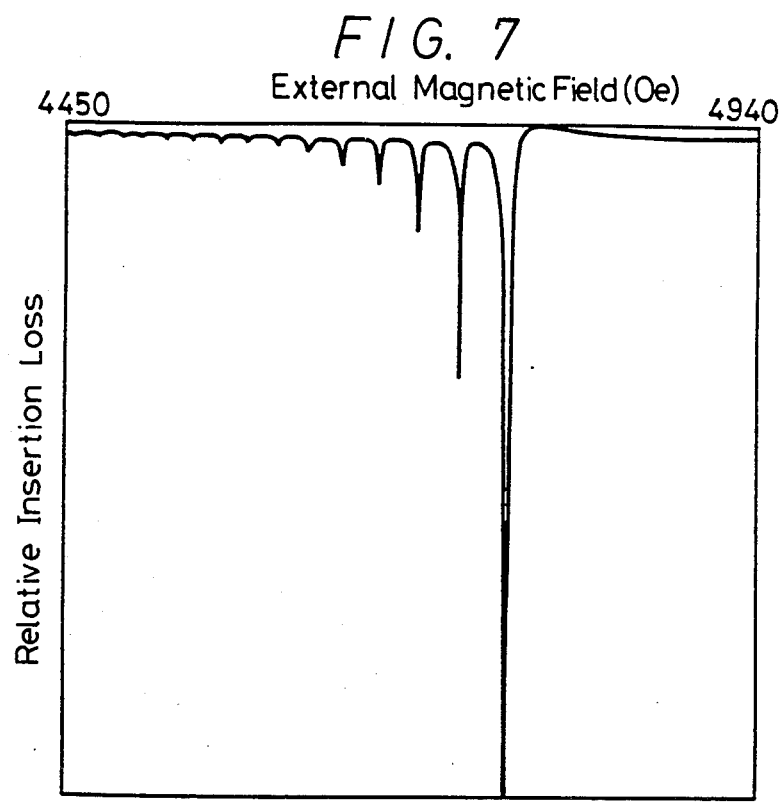
FIGS. 7, 8, 9a, 9b, 12, 13, 14, 15 and 17 are respectively diagrams useful for explaining the present invention.

In this embodiment, the resonator is formed of the YIG thin film magnetic resonance element which is formed by the thin film forming technique. In this case, it is desired to suppress a spurious response caused by magnetostatic modes. More specifically, the magnetic resonance element (YIG single crystal sphere) made of a single crystal sphere has an advantage in that the magnetostatic mode is difficult to be excited and the sole resonance mode by uniform precession mode can be obtained. The magnetic resonance element made of the YIG thin film has, on the other hand, a defect in that even if it is located in a good uniform RF magnetic field the, magnetostatic mode is greatly excited because the internal DC magnetic field is not uniform. Magnetostatic modes occurring when a DC magnetic field is perpendicularly applied to the surface of a disc-shaped sample made of ferrimagnetic material are analyzed in the publication (Journal of Applied Physics, Vol 48, July 1977, pp. 3001 to 3007) in which each mode is indicated as an (n, N)m scheme. The (n, N)m mode has n nodes in the circumferential direction thereof, N nodes in the radius direction thereof and (m−1) nodes in the thickness direction thereof. When the uniformity of the RF magnetic field throughout the sample is excellent, $(1, N)_1$ series becomes a main magnetostatic mode. FIG. 7 shows the measured results of ferromagnetic resonance of a disk-shaped YIG thin film sample measured in a cavity resonator operating at a frequency of 9 GHz, in which magnetostatic modes of $(1, N)_1$ series are excited significantly. When the above-described microwave element such as the filter and the like are constructed by using this sample the, magnetostatic mode of $(1, 1)_1$ which is the uniform mode is used and at this time other magnetostatic modes all cause a spurious response. Thus there is concern that spurious oscillations and mode jumps will be caused. Therefore, it is desired for each magnetic resonance element made of ferrimagnetism material thin film, for example, YIG thin film, to provide means which suppress the excitation of the magnetostatic modes which will become spurious responses without deteriorating the uniform mode. This will be described next.

Figure 8:
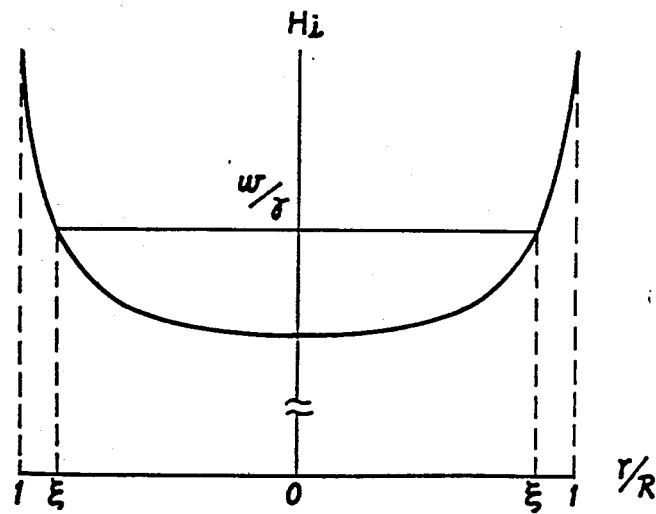
Figure 9A:
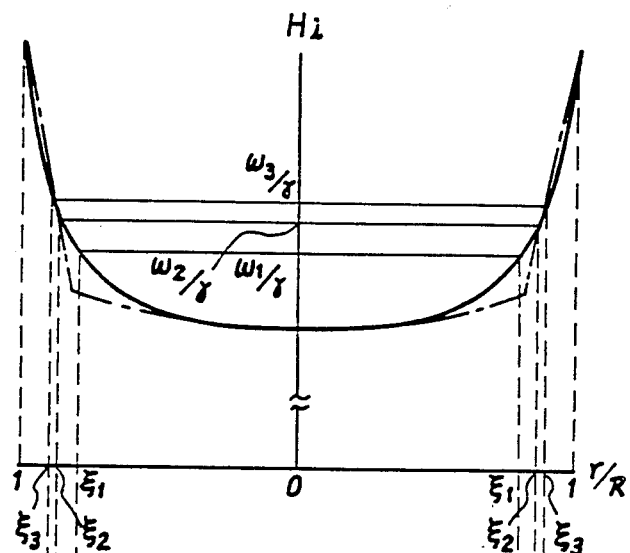
Figure 9B:
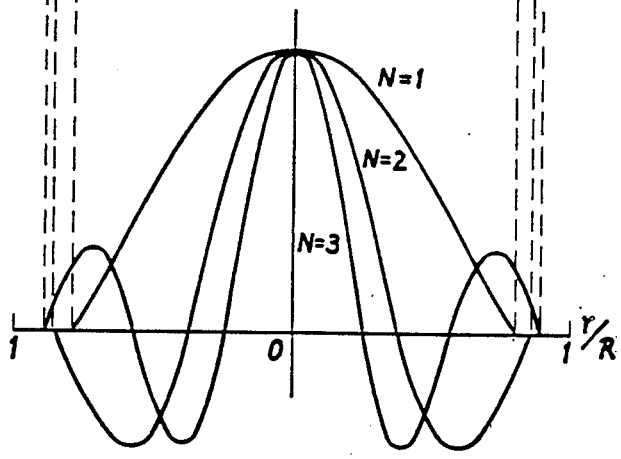

FIG. 8 shows the state of an internal DC magnetic field Hi when a DC magnetic field is applied to the YIG disk-shaped thin film with a thickness t and a diameter D (radius R) in the direction perpendicular to its surface. In this case, its aspect ratio t/D is sufficiently small and the magnetic field distribution in the thickness direction of the sample is neglected. Since the demagnetizing field is large in the inside of the disk and becomes suddenly smaller at its outer periphery so that the internal DC magnetic field is small near the center thereof and becomes suddenly large near the outer periphery thereof. According to the analyzed results of the aforedescribed literature, if a value of r/R at the position where Hi=ω/γ is taken as §, the magnetostatic mode lies in the region of $0 \leq r/R \leq §$ where ω is the resonance angular frequency at the magnetostatic mode and γ is the gyromagnetic ratio. When the magnetic field is fixed, the resonance frequency is increased as the mode number N becomes larger so that the region of the magnetostatic mode is extended gradually to the outside as shown in FIG. 9A. FIG. 9B shows distributions of RF magnetization, of the sample with respect to three lower-order modes of the $(1, N)_1$ mode where the absolute value represents the magnitude of the RF magnetization and the reference designates the phase relationship of the RF magnetization. As is clear from FIG. 9, since the RF magnetization becomes different in the magnetostatic modes, if this is utilized, it becomes possible to suppress the excitation of the magnetostatic mode which will become the spurious response without substantially affecting the uniform mode.

Figure 10:
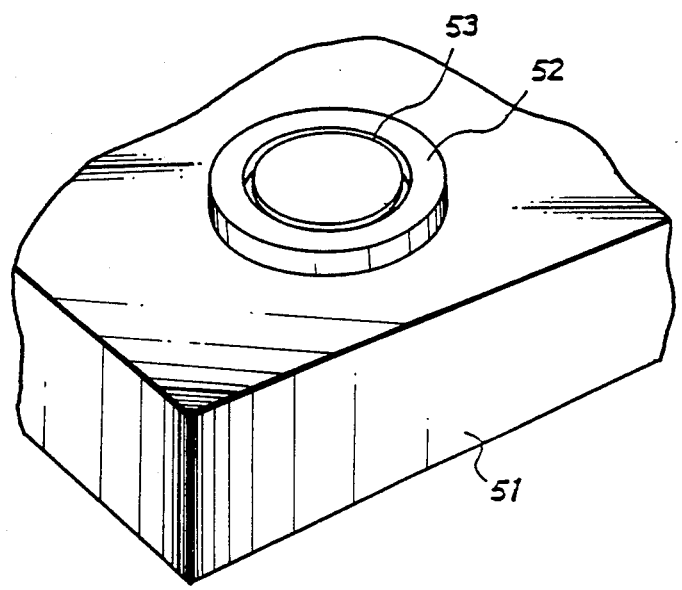
FIGS. 10 and 16 are respectively perspective views illustrating examples of an YIG thin film magnetic resonance elements.

Practically, as shown in FIG. 10, an annular groove 53 is formed by, for example, a selective etching technique on an YIG thin film magnetic resonance element 52 of, for example, a disc shape which is formed on a GGG substrate 51 to thereby provide an annular thin portion. In this case, the YIG thin film magnetic resonance element 52 is made sufficiently small in thickness and the magnetostatic mode in this case is $(1, N)_1$ mode.

Figure 11:
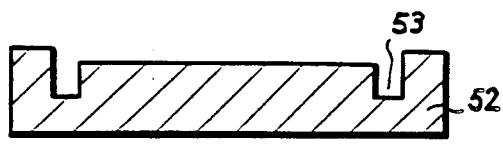
FIG. 11 is a cross-sectional view of FIG. 10.

The groove 53 is formed concentrical with the element 52 at a position where the RF magnetization of the $(1, 1)_1$ mode becomes zero. Further, the groove 53 may be formed continuously or discontinuously. Furthermore, the area encircled by the groove 53 may be formed thinner than its outside portion as shown in FIG. 11. In this case, in the inside area close to the groove 53, the demagnetizing field is raised and hence the demagnetizing field becomes substantially uniform up to this area. In other words, as shown by a one-dot chain line in FIG. 9A, the internal DC magnetic field becomes substantially uniform over a wide range in the radius direction. Thus, it becomes possible to suppress much more than excitation of the magnetostatic mode except the uniform mode.

In such magnetic resonance element, the magnetization is controlled the groove 53. In this case, since the groove 53 is placed at the position where the RF magnetization becomes zero for $(1, 1)_1$ mode, the excitation of the $(1, 1)_1$ mode is not affected. The groove 53, on the other hand, is placed at the position where the RF magnetization is not zero originally for other magnetostatic modes so that the magnetization is partially decreased. As a result, the excitation of these modes is weakened so that it is possible to suppress spurious responses without destroying the uniform mode.

Since the distribution of the RF magnetization in the YIG thin film (see FIG. 9B) is independent of the magnitude of the saturation magnetization of the sample and also is not largely dependent on the aspect ratio, even if the saturation magnetization and the thickness of the ferrimagnetism layer 52 are different, it is not necessary to change the position of the groove 53 in accordance therewith.

Figure 12:
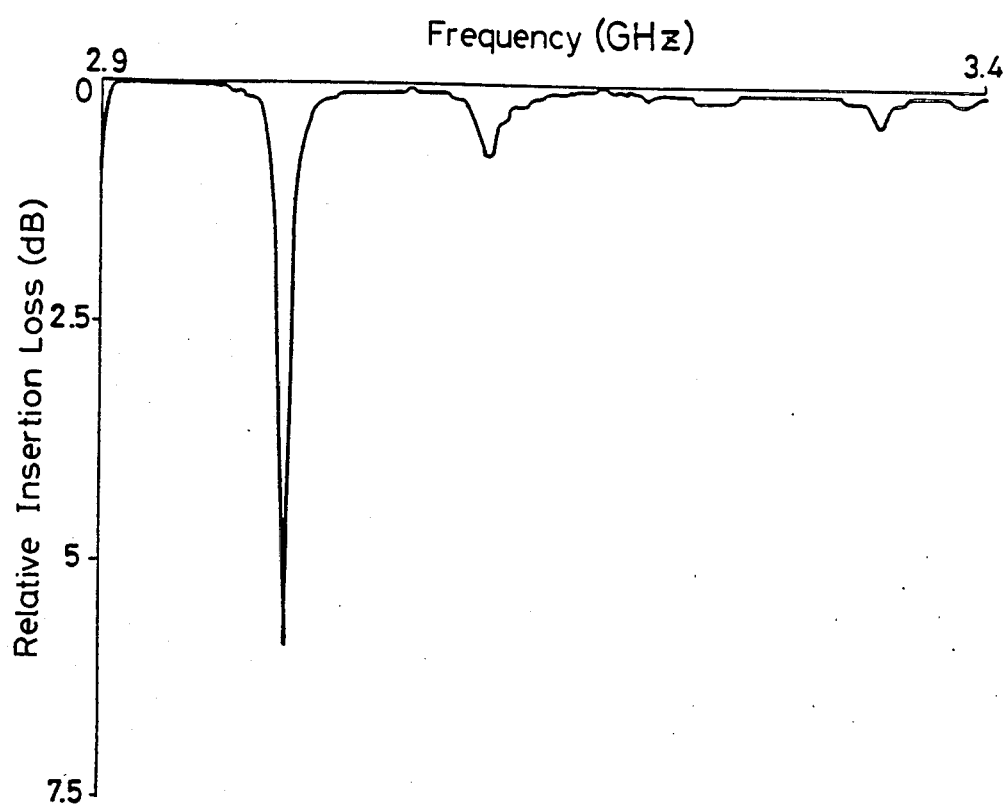

Experimentally, the groove 53 having a radius of 0.8 mm and a depth of 2 μm was formed in the YIG thin film element having a thickness of 20 μm which was made and a radius of 1 mm made from a YIG thin film and the ferromagnetic resonance thereof was measured by using the microstrip line. Measured results of its insertion loss are indicated in FIG. 12 and the value of the unloaded Q-factor was is 775.

In the disk-shaped YIG thin film resonance element, the RF magnetization $(1, 1)_1$ mode became zero at the position of r/R=0.8.

Figure 13:
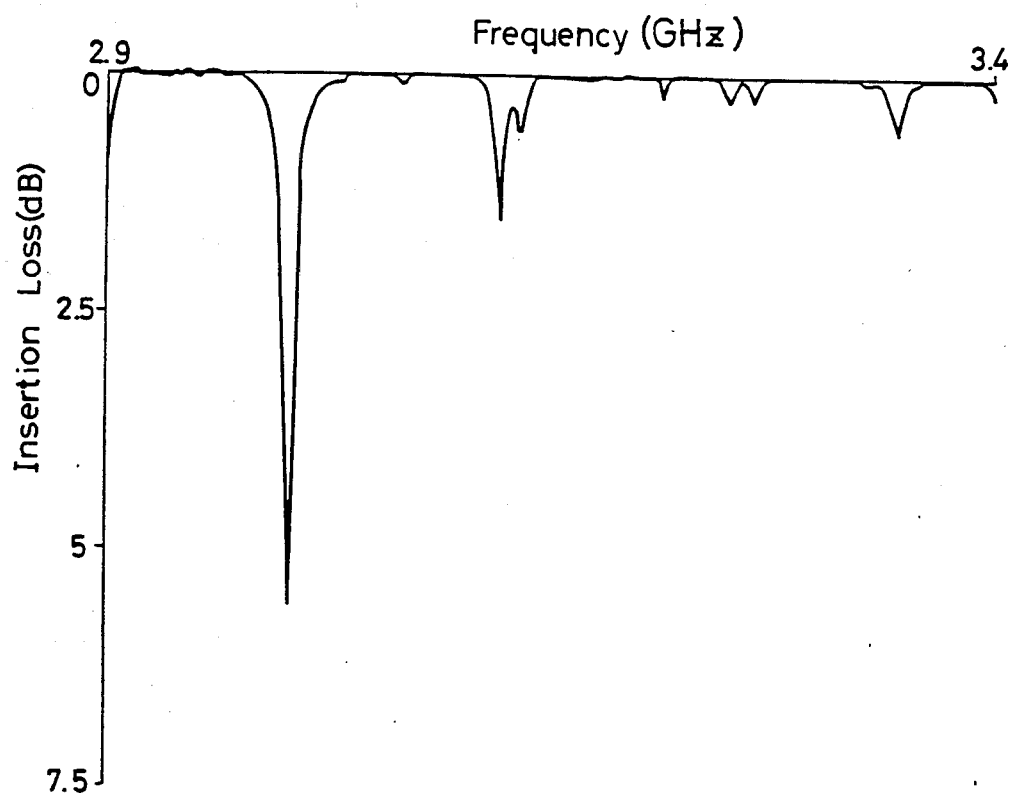

Further, with respect to the YIG thin film element (without groove) having a thickness of 20 μm and a radius of 1 mm made of the same YIG thin film, a ferromagnetic resonance was measured by using the microstrip line. Measured results of its insertion loss at that time are as shown in FIG. 13 and the value of the unloaded Q-factor was 660. As is understood from the above-mentioned comparison, according to this embodiment, the excitation of the magnetostatic mode except the $(1, 1)_1$ mode can be suppressed and spurious responses can be suppressed. Further, since the uniform mode is not damaged, the unloaded Q-factor is not decreased.

Figure 14:
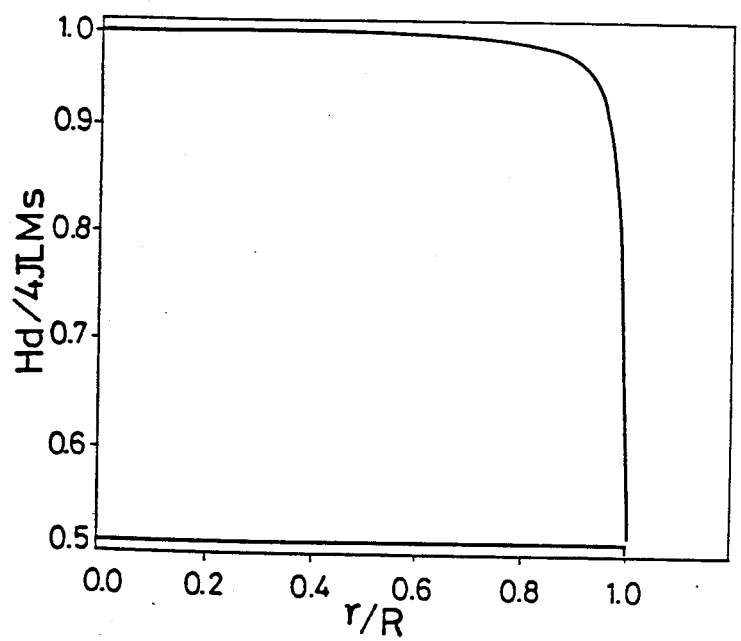
Figure 15:
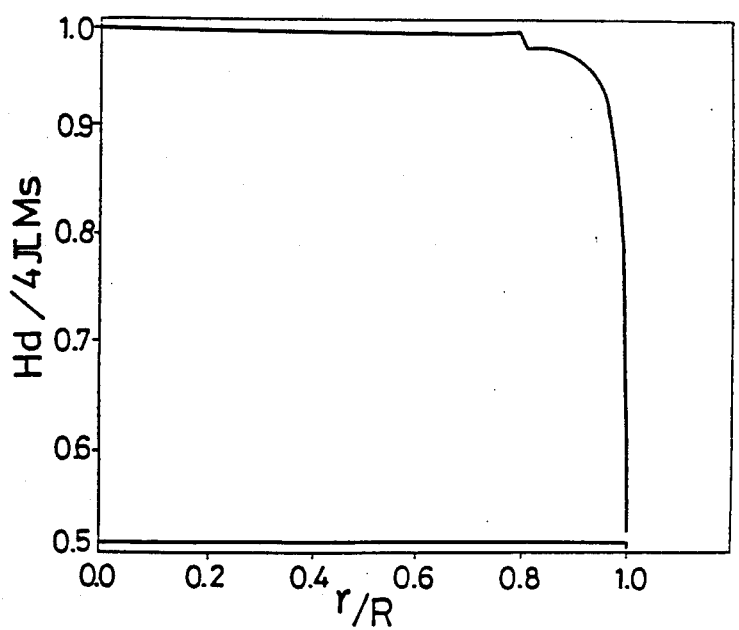

Alternatively, as another structure which can sufficiently suppress the excitation of the magnetostatic mode which becomes a spurious response in the magnetic resonance element made of the YIG thin film, it may be considered to form the internal area of the ferrimagnetic thin film so that it is thin as compared with its outside area. This will be now described. An internal DC magnetic field Hi presented when a DC magnetic field Ho is applied to an YIG disk-shaped thin film having a thickness t and a diameter D (radius R) in the direction perpendicular to the film surface thereof is expressed as Hi=Ho−Hd(r/R)−Ha where Hd is the demagnetizing field and Ha is the anisotropic magnetic field. In this case, the aspect ratio, t/D is assumed to be small enough and the distribution of the magnetic field in the thickness direction of the sample is neglected. FIG. 14 shows the calculated results of the demagnetizing field Hd of an YIG disc having a thickness of 20 μm and a radius of 1 mm. Since the demagnetizing field Hd is large in the inside of the disc and becomes suddenly small at the peripheral portion thereof, the internal DC magnetic field is small near the center and becomes suddenly large near the outer peripheral portion thereof. FIG. 15, on the other hand, shows the calculated results of the demagnetizing field distribution in a case where the film thickness of the area within the inside of the same YIG thin film with a radius of 0.8 mm is thinned by 1 μm. From FIG. 15, it will be seen that when the thickness of the inside area is thinned a small amount, that the demagnetizing field near the peripheral portion of the area with the thickness being reduced is raised a small amount and the flat region of the demagnetizing field is widened.

Figure 16:
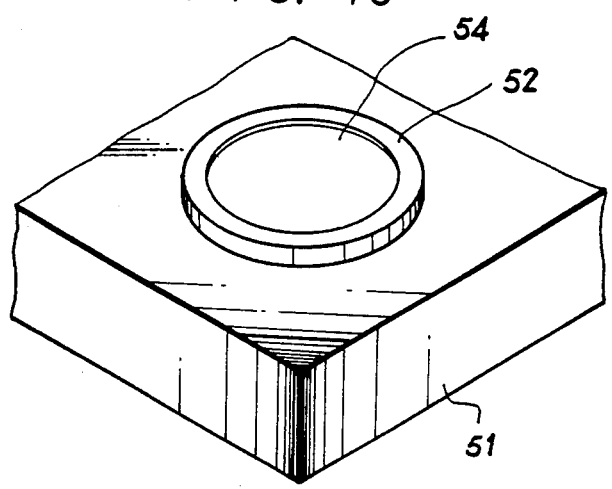

Accordingly, as described above, when the inside area of the YIG thin film element is reduced in thickness as compared with its outside area, the flat region of the demagnetizing field in the inside area is widened with the result that the magnetostatic mode which causes the spurious response can be suppressed. For example, as shown in FIG. 16, a ferrimagnetic YIG thin film element 52 is formed on a GGG substrate 51. A concave portion 54 is formed on the upper surface of the YIG thin film element 52 so as to reduce the thickness of the inside area as compared with that of the outside area thereof. The thickness of the YIG thin film 52 is made small enough so as to make the magnetic field distribution in the thickness direction thereof uniform. In this case, the magnetostatic mode is (l, N)₁ mode.

The concave portion 54 is extended to a position where the excitation of the magnetostatic mode that becomes the spurious response can be suppressed sufficiently, preferably at a position where the amplitude of the (l, l)₁ mode becomes zero. For instance, when the YIG thin film element 52 is circular in shape, the concave portion 54 is extended to the position 0.75 to 0.85 times the diameter thereof.

Figure 17:
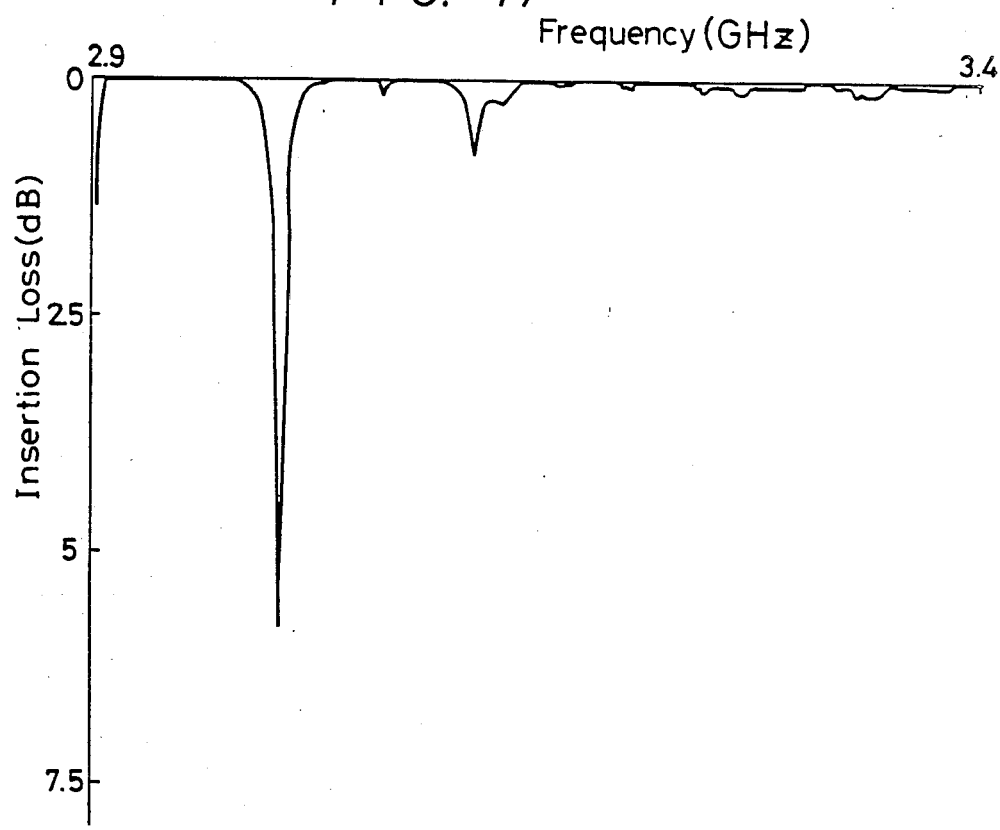

Experimentally, the disk-shaped concave portion 54 having a depth of 1.7 μm and a radius of 0.75 mm was concentrically formed on the YIG thin film magnetic resonance element having a thickness of 20 μm and a radius of 1 mm and the ferromagnetic resonance thereof was measured by using the microstrip line. FIG. 17 shows the measured result of the insertion loss thereof. In this case, the value of the unloaded Q-factor was 865.

Since the resonance frequency of the magnetic resonance element, for example, the YIG thin film element depends on the saturation magnetization of the element, the resonance frequency is directly affected by the temperature characteristic of the saturated magnetization. If, in the above-mentioned resonator circuit, the resonant frequency of the YIG thin film element used therein fluctuates due to the change of, for example, the ambient temperature thereof, and the resonant frequency will drift. To avoid this disadvantage, for example, at least one of the magnetic poles 4 and 5 of the yoke 1 is provided with a soft magnetic plate made of a material having the same temperature characteristic as the YIG thin film element 52, for example, YIG whereby the soft magnetic plate functions such that the temperature dependency of the magnetic field in the magnetic gap 2 compensates for the temperature dependency of the YIG thin film element itself, thus for changes of the characteristic of the YIG thin film element due to the temperature changes are reduced.

According to this embodiment, the magnetic flux generated between the magnetic poles 4 and 5 can be varied by varying the value of the current applied to the coil 6 whereby to vary the oscillating frequency. In this case, the minimum frequency f min of the oscillating frequency is given as $$f\min = \gamma(N_T 4\pi Ms + Hs)$$

where $\gamma$ is the gyromagnetic ratio, $N_T$ the demagnetizing factor, Ms the saturation magnetization and Hs the saturated magnetic field. Since $N_T$ of the YIG sphere is given as $N_T = \frac{1}{3}$ and $N_T$ of the YIG thin film is given as $N_T \ll 1$, the lower limit of the variable frequency of the tuned oscillator using this YIG thin film is lower than that of the tuned oscillator using the YIG sphere, which widens the variable frequency range thereof by that amount. Further, in the tuned oscillator using the YIG sphere, if the DC magnetic field to be applied is varied gradually, the main magnetostatic mode (110) and other magnetostatic mode have the same frequency occasionally and this causes spurious oscillation and the deviation of the tuning. In the tuned oscillator using the YIG thin film of this embodiment, when the DC magnetic field is varied, (l, N)₁ modes are all equally varied in frequency, and no modes and the defects are not caused. In general, if, in the YIG disk plate produced from a bulk crystal, both surfaces thereof are not mirror-polished, the unloaded Q-factor can not be raised. The YIG thin film produced by the thin film forming technique, on the other hand, requires no mirror-polishing and the GGG substrate can be used as the substrate of the tuned oscillator as it is.

Further, since the uniform mode of N=1 which is the main mode of the magnetostatic mode (l, N)₁ of the YIG thin film is used, the unloaded Q-factor thereof is high and SSB (single-side-band) phase noise can be lowered. Furthermore, since the outer Q-factor can be lowered, it is possible to widen the variable frequency oscillating range. In addition, according to this embodiment, the YIG thin film is used, and it is free of the above-described disadvantages which are inherent in the YIG sphere.

Figure 22:
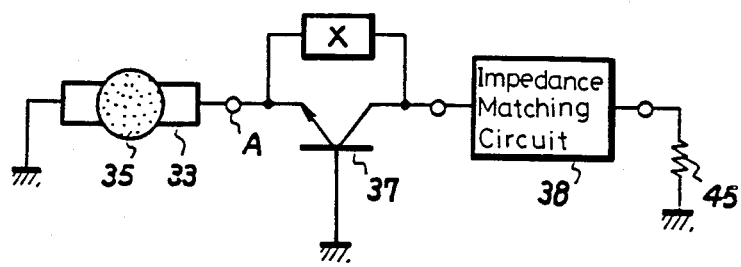
Figure 23:
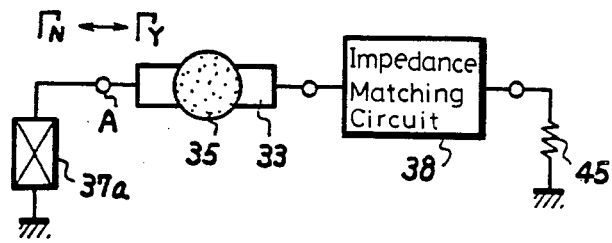
Figure 24:
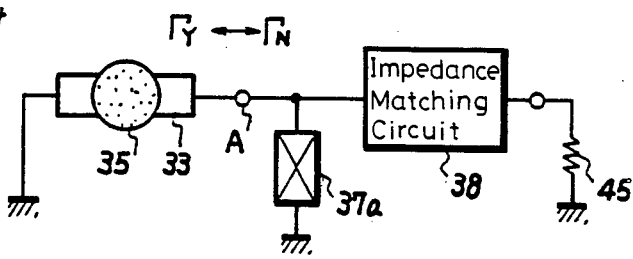
Figure 25:
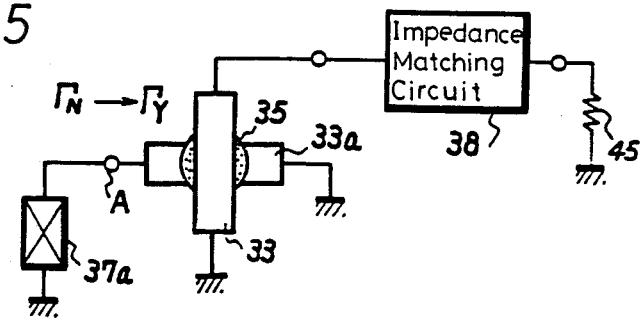

FIGS. 18 to 25 respectively illustrate other embodiments of the tuned oscillator circuit according to this invention. In FIGS. 18 to 25, like parts corresponding to those of FIG. 5 are marked with the same references and will not be described in detail. FIGS. 18 to 22 illustrate the embodiments of the tuned oscillator circuits which use the bipolar transistor 37 as the active element thereof. FIGS. 23 to 25, on the other hand, illustrate the embodiments of the tuned oscillator circuits which use a 2-terminal element such as a Gunn diode, an IMPATT diode and the like as the active element thereof.

FIG. 18 illustrates a modified example of FIG. 5 in which the strip line 33 for coupling is grounded through a characteristic impedance AZ₀. In the tuned oscillator circuit in FIG. 18, when the YIG thin film magnetic resonance element 35 does not resonate, $\Gamma_Y=0$, namely, $\Gamma_Y$ becomes the center of the Smith chart so that the amplitude condition for starting oscillation is not established, thus the possibility of parasitic oscillation becomes very small.

FIG. 19 illustrates the example of the tuned oscillator circuit in which the YIG thin film magnetic resonance element 35 is sandwiched between two coupling strip lines 33 and 33a, the emitter of the transistor 37 is grounded through the strip line 33 and the base of the transistor 37 is grounded through the strip line 33a. In the example of FIG. 19, the YIG thin film magnetic resonance element 35 is located as a band-pass filter in the feedback circuit which serves other than the output circuit, and where when the YIG thin film magnetic resonant element 35 resonates, positive feedback is applied and the condition of $|\Gamma_N|>1$ is established. Particularly, when one of the strip lines that are connected to the base and emitter is terminated by the characteristic impedance $Z_0$, the possibility of parasitic oscillation becomes small.

FIG. 20 illustrates the example of the tuned oscillator circuit in which the emitter of the transistor 37 is grounded through a reactive circuit $X_1$, the base of the transistor 37 is grounded through a reactive circuit $X_3$ and the collector of the transistor 37 is grounded through a series circuit of the coupling strip line 33 of the YIG thin film magnetic resonance element 35, the impedance matching circuit 38 and a load 45. In this case, the YIG thin film magnetic resonance element 35 is located in the output terminal as a band-blocking filter. A part of the signal is fed back to the negative resistance circuit at the YIG resonance frequency so that this tuned oscillator circuit is operated as a self-injection locking-type oscillator.

FIG. 21 illustrates the example of the tuned oscillator circuit in which the YIG thin film magnetic resonance element 35 is sandwiched between the coupling strip lines 33 and 33a, the collector of the transistor 37 is grounded through the strip line 33a and the input terminal of the impedance matching circuit 38 is grounded through the strip line 33. Other portions are formed similarly to the example of FIG. 20. In this case, the YIG thin film magnetic resonance element 35 is located as a band-pass filter in the output terminal and if this YIG thin film magnetic resonance element 35 does not resonate, the load 45 is short-circuited and the phase condition for oscillation is not established. If, on the other hand, the YIG thin film magnetic resonance element 35 resonates, the load 45 and the impedance matching circuit 38 are seen through the YIG thin film magnetic element 35 so that the oscillation condition can be satisfied.

FIG. 22 illustrates the examples of the tuned oscillator circuit in which the tuned oscillator circuit of FIG. 5 is formed as a parallel feedback oscillator. The examples of the tuned oscillator circuit of FIGS. 20 and 21 can be formed as parallel feedback oscillator circuits, respectively.

FIG. 23 illustrates the example of the tuned oscillator circuit in which one terminal of the coupling strip line 33 of the YIG thin film magnetic resonance element 35 is grounded through a 2-terminal active element 37a and the other end of the strip line 33 is grounded through the series circuit of the impedance matching circuit 38 and the load 45, establishing the above-mentioned oscillating condition with respect to the $\Gamma_N$ and $\Gamma_Y$ as seen from terminal A. In this case, the YIG thin film magnetic resonance element 35 is located as a band-blocking filter in the output terminal and a part of the signal is fed back to the 2-terminal active element 37a at the YIG resonance frequency so that the tuned oscillator circuit of this embodiment is operated as a self-injection locking-type oscillator.

FIG. 24 illustrates the example of the tuned oscillator circuit in which one end of the coupling strip line 33 of the YIG thin film magnetic resonance element 35 is grounded, while the other end of this strip line 33 is grounded through the 2-terminal active element 37a and also grounded through the series circuit of the impedance matching circuit 38 and the load 45. In FIG. 24, the negative resistance circuit 43 of FIG. 4 is the 2-terminal active element 37a.

FIG. 25 illustrates the example of the tuned oscillator circuit in which the YIG thin film magnetic resonance element 35 is sandwiched between the two coupling strip lines 33 and 33a, one end of the 2-terminal active element 37a is grounded, and other end thereof is grounded through this strip line 33a and the input terminal of the impedance matching circuit 38 is grounded through the strip line 33, other portions being formed similarly to FIG. 23. In this case, the YIG thin film magnetic resonance element 35 is located as a band-pass filter at the output terminal and if the YIG thin film magnetic resonance element 35 does not resonate, the load 45 is short-circuited and thence the phase condition for oscillation is not established. If, on the other hand, the YIG thin film magnetic resonance element 35 resonates, the load 45 and the impedance matching circuit 38 are seen through the YIG thin film magnetic resonance element 35 so that the oscillation condition can be established.

The oscillator circuits used in this invention are not limited to the above-described embodiments but other oscillator circuits can of course be applied to the present invention. While in the afore-described embodiments the bipolar transistor is used as the 3-terminal active element, a field effect transistor can be used as the 3-terminal active element. Furthermore, the present invention is not limited to the above-described embodiments but can take various modifications and variations without departing from the gist of the invention.

According to this invention, since the YIG thin film magnetic resonance element formed by the so-called thin film forming technique such as liquid phase epitaxial growth technique, sputtering, chemical liquid phase growth technique and so on is used as the resonator, the advantages of the YIG can be utilized effectively and the defects of the YIG sphere can be improved.

The above description is given for the preferred embodiments of the invention, but it will be apparent that many modifications and variations could be effected by one skilled in the art without departing from the spirits or scope of the novel concepts of the invention, so that the scope of the invention should be determined by the appended claims only.

We claim as our invention:

1. A tuned oscillator comprising: an active element; and a ferromagnetic resonator connected to said active element;

said ferromagnetic resonator being formed of a ferrimagnetic crystal, a microstrip line electromagnetically coupled to said ferrimagnetic crystal and D.C. (direct current), bias magnetic field means applying D.C. (direct current) bias magnetic field to said ferrimagnetic crystal, said ferrimagnetic crystal being formed of an YIG (yttrium, iron, garnet) thin film formed by a thin film forming technique and being processed to suppress magnetostatic modes of ferromagnetic resonance other than the uniform mode.

2. A tuned oscillator according to claim 1, wherein said ferrimagnetic crystal is a thin film of YIG formed on a non-magnetic substrate by liquid phase epitaxial growth.

3. A tuned oscillator according to claim 2, wherein said non-magnetic substrate is a single crystal gadolinium gallium garnet.

4. A tuned oscillator according to claim 1, wherein said ferrimagnetic crystal is a thin disk of YIG having a groove at a peripheral portion of said disk.

5. A tuned oscillator according to claim 1, wherein said ferrimagnetic crystal is a thin disk of YIG having a thickness at a central portion of said disk which is smaller than the thickness at a peripheral portion of said disk.

6. A tuned oscillator according to claim 1 wherein said ferrimagnetic crystal is a disk of YIG which is thicker at its central portion than at its peripheral portion.

7. A tuned circuit oscillator according to claim 1 including an impedance matching element connected to said active element.

8. A tuned circuit oscillator according to claim 1 including an impedance matching element connected to said ferrimagnetic crystal.

* * * * *